United States Patent
Lee et al.

(10) Patent No.: US 10,847,590 B2
(45) Date of Patent: Nov. 24, 2020

(54) ELECTROLUMINESCENT DISPLAY DEVICE AND METHOD OF MANUFACTURING THE SAME

(71) Applicant: LG DISPLAY CO., LTD., Seoul (KR)

(72) Inventors: Hak-Min Lee, Paju-si (KR); Young-Jun Yu, Paju-si (KR); Hee-Jin Kim, Paju-si (KR); Myung-O Joo, Paju-si (KR); Sung-Soo Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/706,405

(22) Filed: Dec. 6, 2019

(65) Prior Publication Data

US 2020/0194522 A1   Jun. 18, 2020

(30) Foreign Application Priority Data

Dec. 14, 2018   (KR) .......................... 10-2018-0161943

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0007* (2013.01); *H01L 51/0018* (2013.01); *H01L 51/0028* (2013.01); *H01L 51/56* (2013.01); *H01L 2227/323* (2013.01)

(58) Field of Classification Search
CPC ............. H01L 27/3246; H01L 51/0007; H01L 51/0018; H01L 51/56; H01L 51/0028; H01L 2227/323; H01L 51/0003; H01L 27/3211
See application file for complete search history.

(56) References Cited

U.S. PATENT DOCUMENTS

| | | | | |
|---|---|---|---|---|
| 9,461,098 | B2* | 10/2016 | Choi | H01L 27/3246 |
| 10,665,648 | B2* | 5/2020 | Paek | H01L 27/3248 |
| 2016/0079323 | A1* | 3/2016 | Choi | H01L 27/3246 |
| | | | | 257/40 |
| 2017/0062535 | A1* | 3/2017 | Kim | H01L 27/3246 |
| 2019/0165085 | A1* | 5/2019 | Choi | H01L 51/5228 |

(Continued)

FOREIGN PATENT DOCUMENTS

| | | |
|---|---|---|
| CN | 106129264 B | 6/2018 |
| EP | 3343626 A1 | 7/2018 |

(Continued)

*Primary Examiner* — Victor A Mandala
(74) *Attorney, Agent, or Firm* — Birch, Stewart, Kolasch & Birch, LLP

(57) ABSTRACT

An electroluminescent display device can include a plurality of sub-pixels arranged on a substrate along a first direction and a second direction; a light-emitting diode disposed at each sub-pixel and including a first electrode, a light-emitting layer and a second electrode; a first bank disposed between adjacent sub-pixels along the second direction and overlapping edges of the first electrode; a second bank having an opening corresponding to the sub-pixels arranged along the second direction and disposed between adjacent sub-pixels along the first direction; and a third bank on side surfaces of the second bank facing each other along the second direction.

14 Claims, 14 Drawing Sheets

(56) References Cited

U.S. PATENT DOCUMENTS

| | | | |
|---|---|---|---|
| 2019/0173011 A1* | 6/2019 | Kwak | H01L 27/3211 |
| 2019/0180682 A1* | 6/2019 | Kim | G09G 3/3233 |
| 2019/0189711 A1* | 6/2019 | Ryoo | H01L 27/3246 |
| 2019/0206955 A1* | 7/2019 | Paek | H01L 27/3276 |
| 2019/0363146 A1* | 11/2019 | Takahashi | H05B 33/22 |
| 2020/0119106 A1* | 4/2020 | Kim | H01L 51/56 |

FOREIGN PATENT DOCUMENTS

| | | |
|---|---|---|
| EP | 3343629 A1 | 7/2018 |
| KR | 10-2013-0057908 A | 6/2013 |
| KR | 10-2018-0076820 A | 7/2018 |

* cited by examiner

ELECTROLUMINESCENT DISPLAY DEVICE AND METHOD OF MANUFACTURING THE SAME

CROSS-REFERENCE TO RELATED APPLICATION

The present application claims priority from and the benefit under 35 U.S.C § 119(a) of Korean Patent Application No. 10-2018-0161943 filed in the Republic of Korea on Dec. 14, 2018, which is hereby incorporated by reference in its entirety into the present application.

BACKGROUND OF THE INVENTION

Field of the Disclosure

The present disclosure relates to an electroluminescent display device, and more particularly, to an electroluminescent display device having a large size and high definition and a method of manufacturing the same.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has red, green and blue sub-pixels, and displays various color images by allowing the red, green and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask (FMM).

However, the evaporation process increases manufacturing costs due to preparation of the mask and has a problem in application to a large-sized and high-definition display device due to manufacturing variations, sagging, shadow effect of the mask, and the like.

SUMMARY OF THE INVENTION

Accordingly, the present disclosure is directed to an electroluminescent display device and a method of manufacturing the same that substantially obviate one or more of the problems due to limitations and disadvantages of the related art.

An object of the present disclosure is to provide an electroluminescent display device having a large size and high definition and a method of manufacturing the same.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a plurality of sub-pixels arranged on a substrate along a first direction and a second direction; a light-emitting diode disposed at each sub-pixel and including a first electrode, a light-emitting layer and a second electrode; a first bank disposed between adjacent sub-pixels along the second direction and overlapping edges of the first electrode; a second bank having an opening corresponding to the sub-pixels arranged along the second direction and disposed between adjacent sub-pixels along the first direction; and a third bank on side surfaces of the second bank facing each other along the second direction.

There is also provided a method of manufacturing an electroluminescent display device that includes forming a first electrode in each sub-pixel on a substrate on which a plurality of sub-pixels arranged along a first direction and a second direction are defined; forming a first bank disposed between adjacent sub-pixels along the second direction and overlapping edges of the first electrode; forming a second bank on the first bank, the second bank having an opening corresponding to the sub-pixels arranged along the second direction and disposed between adjacent sub-pixels along the first direction; forming a photoresist pattern corresponding to the opening, the photoresist pattern covering the first electrode and the first bank and exposing the second bank; forming a first insulating pattern and a second insulating pattern, the first insulating pattern disposed on a top surface and side surfaces of the second bank, and the second insulating pattern disposed on the photoresist pattern; forming a third bank on the side surfaces of the second bank by removing the photoresist pattern and the second insulating pattern; forming a solution layer in the opening and contacting the third bank; forming a light-emitting layer by drying the solution layer; and forming a second electrode on the light-emitting layer.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION OF THE EMBODIMENTS

Reference will now be made in detail to embodiments of the disclosure, examples of which are illustrated in the accompanying drawings.

An electroluminescent display device according to an embodiment of the present disclosure has a display area displaying an image and a non-display area surrounding the display area. The display area includes a plurality of pixels, and each of the plurality of pixels includes red, green and blue sub-pixels, but may have different color arrangements. A pixel region corresponding to each sub-pixel can have a configuration shown in FIG. 1

Figure 1:
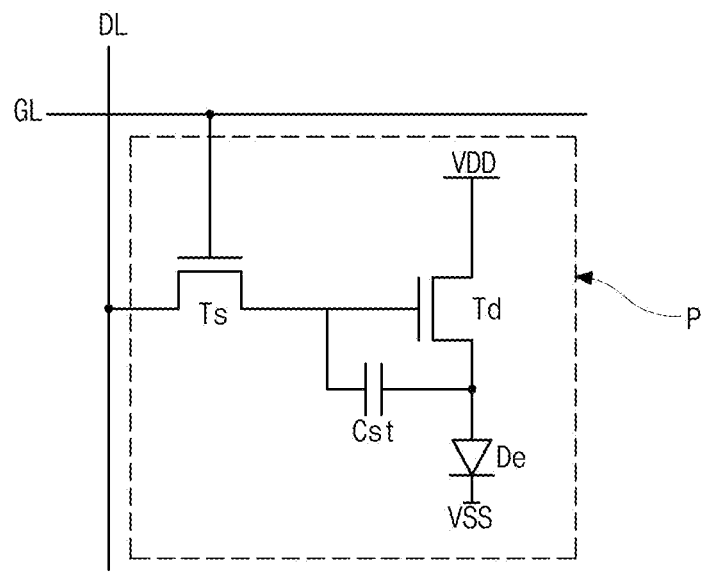
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure. All the components of the electroluminescent display device according to all embodiments of the present disclosure are operatively coupled and configured.

In FIG. 1, the electroluminescent display device according to the embodiment of the present disclosure includes a plurality of gate lines and a plurality of data lines crossing each other to define a plurality of pixel regions. Particularly, in the example of FIG. 1, a gate line DL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more transistors and/or capacitors can be added in the pixel region P in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

Figure 2:
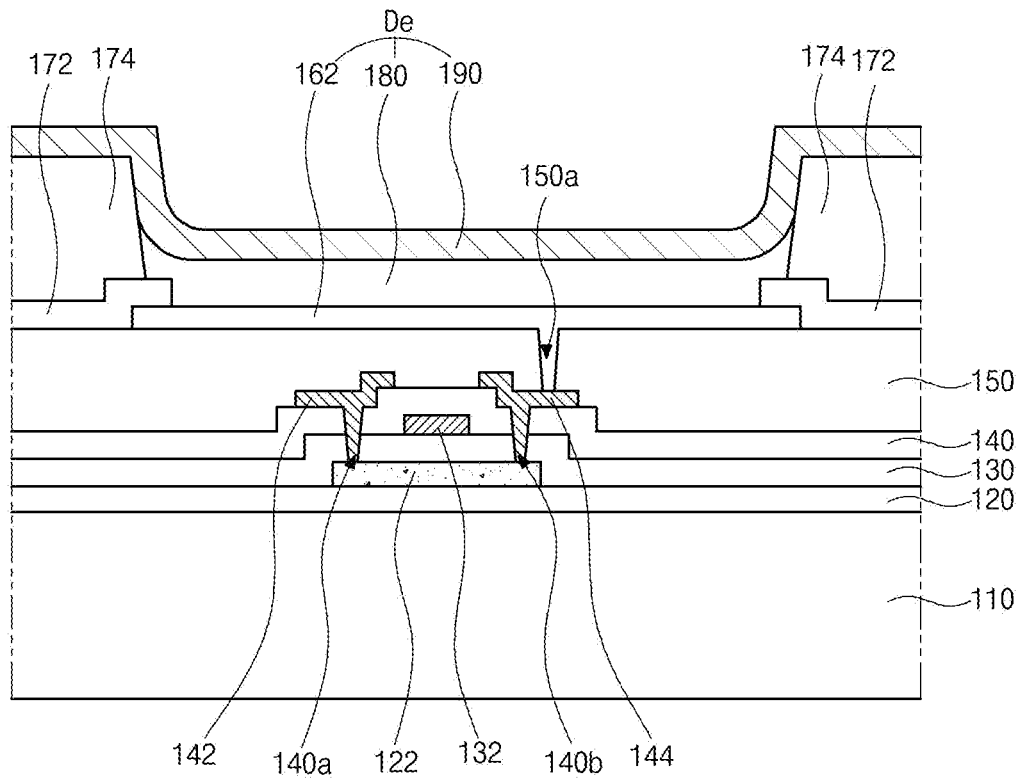
FIG. 2 is a schematic cross-sectional of an electroluminescent display device according to the embodiment of the present disclosure.

FIG. 2 is a schematic cross-sectional of an electroluminescent display device according to the embodiment of the present disclosure and shows one pixel region.

In the electroluminescent display device of FIG. 2, a buffer layer 120 is formed on a substrate 110. The buffer layer 120 is disposed substantially on an entire surface of the substrate 110. The substrate 110 can be a glass substrate or a plastic substrate. For example, polyimide can be used as the plastic substrate. The buffer layer 120 can be formed of an inorganic material, such as silicon oxide ($SiO_2$) or silicon nitride (SiNx), and can be a single layer or multiple layers.

A patterned semiconductor layer 122 is formed on the buffer layer 120. The semiconductor layer 122 can be formed of an oxide semiconductor layer, and a light-shielding pattern can be further formed under the semiconductor layer 122. The light-shielding pattern can block light incident on the semiconductor layer 122 and can prevent the semiconductor layer 122 from deteriorating due to the light. Alternatively, the semiconductor layer 122 can be formed of polycrystalline silicon, and both ends of the semiconductor layer 122 can be doped with impurities.

A gate insulating layer 130 of an insulating material is formed on the semiconductor layer 122 substantially over the entire surface of the substrate 110. The gate insulating layer 130 can be formed of an inorganic insulating material such as silicon oxide ($SiO_2$) or silicon nitride (SiNx). When the semiconductor layer 122 is made of an oxide semiconductor material, the gate insulating layer 130 can be formed of silicon oxide ($SiO_2$). Alternatively, when the semiconductor layer 122 is made of polycrystalline silicon, the gate insulating layer 130 can be formed of silicon oxide ($SiO_2$) or silicon nitride (SiNx).

A gate electrode 132 of a conductive material such as metal is formed on the gate insulating layer 130 corresponding to the center of the semiconductor layer 122. In addition, a gate line and a first capacitor electrode can be formed on the gate insulating layer 130. The gate line extends in a first direction, and the first capacitor electrode is connected to the gate electrode 132.

In the embodiment of the present disclosure, the gate insulating layer 130 is formed over the entire surface of the substrate 110. However, the gate insulating layer 130 can be patterned to have the same shape as the gate electrode 132.

An interlayer insulating layer 140 made of an insulating material is formed on the gate electrode 132 substantially over the entire surface of the substrate 110. The interlayer insulating layer 140 can be formed of an inorganic insulating material such as silicon oxide ($SiO_2$) or silicon nitride (SiNx). Alternatively, the interlayer insulating layer 140 can be formed of an organic insulating material such as photo acryl or benzocyclobutene.

The interlayer insulating layer 140 has first and second contact holes 140a and 140b exposing top surfaces of both ends of the semiconductor layer 122. The first and second contact holes 140a and 140b are disposed at both sides of the gate electrode 132 and spaced apart from the gate electrode 132. The first and second contact holes 140a and 140b are also formed in the gate insulating layer 130. Alternatively, when the gate insulating layer 130 is patterned to have the same shape as the gate electrode 132, the first and second contact holes 140a and 140b are formed only in the interlayer insulating layer 140.

Source and drain electrodes 142 and 144 of a conductive material such as metal are formed on the interlayer insulating layer 140. In addition, a data line, a power supply line and a second capacitor electrode can be further formed on the interlayer insulating layer 140.

The source and drain electrodes 142 and 144 are spaced apart from each other with the gate electrode 132 positioned therebetween and are in contact with both ends of the semiconductor layer 122 through the first and second contact holes 140a and 140b, respectively. The data line extends in a second direction and crosses the gate line to thereby define a pixel region. The power supply line for supplying a high voltage is spaced apart from the data line. The second capacitor electrode is connected to the drain electrode 144. The second capacitor electrode overlaps the first capacitor electrode to thereby constitute a storage capacitor with the interlayer insulating layer 140 therebetween as a dielectric. Alternatively, the first capacitor electrode can be connected to the drain electrode 14, and the second capacitor electrode can be connected to the gate electrode 132.

The semiconductor layer 122, the gate electrode 132, and the source and drain electrodes 142 and 144 form a thin film transistor. The thin film transistor has a coplanar structure in which the gate electrode 132 and the source and drain electrodes 142 and 144 are located at the same side with respect to the semiconductor layer 122.

Alternatively, the thin film transistor can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. The semiconductor layer can be formed of oxide semiconductor or amorphous silicon.

The thin film transistor corresponds to a driving thin film transistor, and a switching thin film transistor having the same structure as the driving thin film transistor can be further formed in the pixel region on the substrate 110. The gate electrode 132 of the driving thin film transistor can be connected to a drain electrode of the switching thin film transistor, and the source electrode 142 of the driving thin film transistor is connected to the power supply line. In addition, a gate electrode and a source electrode of the switching thin film transistor can be connected to the gate line and the data line, respectively.

A sensing thin film transistor having the same structure of the driving thin film transistor can be further formed in the pixel region on the substrate 110, but the present disclosure is not limited thereto.

An overcoat layer 150 of an insulating material is formed on the source and drain electrodes 142 and 144 substantially over the entire surface of the substrate 110. The overcoat layer 150 can be formed of an organic insulating material such as photo acryl or benzocyclobutene. The overcoat layer 150 can have a flat top surface.

In the meantime, an insulating layer of an inorganic insulating material such as silicon oxide ($SiO_2$) or silicon nitride (SiNx) can be further formed under the overcoat layer 150.

The overcoat layer 150 has a drain contact hole 150a exposing the drain electrode 144. The drain contact hole 150a can be spaced apart from the second contact hole 140b. Alternatively, the drain contact hole 150a can be disposed right over the second contact hole 140b.

A first electrode 162 is formed on the overcoat layer 150 and formed of a conductive material having a relatively high work function. The first electrode 162 is disposed in the pixel region and is in contact with the drain electrode 144 through the drain contact hole 150a. For example, the first electrode 162 can be formed of a transparent conductive material such as indium tin oxide (ITO) or indium zinc oxide (IZO), but is not limited thereto.

The electroluminescent display device according to the embodiment of the present disclosure is a top emission type in which light of a light-emitting diode De is output toward a direction opposite the substrate 110. Accordingly, the first electrode 162 can further include a reflective electrode or a reflective layer formed of a metal material having a relatively high reflectance below the transparent conductive material. For example, the reflective electrode or reflective layer can be formed of an aluminum-palladium-copper (APC) alloy or silver (Ag). The first electrode 162 can have a triple-layer structure of ITO/APC/ITO or ITO/Ag/ITO, but is not limited thereto.

A first bank 172 of an insulating material is formed on the first electrode 162. The first bank 172 overlaps and covers edges of the first electrode 162 and exposes a central portion of the first electrode 162. The first bank 172 has a hydrophilic property. For example, the first bank 172 can be formed of an inorganic insulating material such as silicon oxide ($SiO_2$) or silicon nitride (SiNx). Alternatively, the first bank 172 can be formed of polyimide.

A second bank 174 of an insulating material is formed on the first bank 172. The second bank 172 has a narrower width than the first bank 172, is disposed on the first bank 172, and exposes edges of the first bank 172. The second bank 174 has a hydrophobic property. A thickness of the second bank 174 can be greater than a thickness of the first bank 172. The second bank 174 can be formed of an organic insulating material having a hydrophobic property. Alternatively, the second bank 174 can be formed of an organic insulating material having a hydrophilic property and can be subjected to a hydrophobic treatment.

Meanwhile, only the first bank 172 can be disposed on other edges of the first electrode 162. In addition, even if the first and second banks 172 and 174 are formed on the edges of the first electrode 162 in FIG. 2, the first bank 172 can be omitted, and only the second bank 174 can overlap and cover the edges of the first electrode 162.

A light-emitting layer 180 is formed on the first electrode 162 exposed by the first and second banks 172 and 174.

The light-emitting layer 180 can include a first charge auxiliary layer, a light-emitting material layer, and a second charge auxiliary layer that are sequentially positioned over the first electrode 162. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

The light-emitting layer 180 is formed through a solution process. Thus, the process can be simplified and a display device with a large size and high resolution can be provided. A spin coating method, an ink jet printing method, or a screen printing method can be used as the solution process, but the present disclosure is not limited thereto. When the solution is dried, a drying speed of a solvent in a region adjacent to the second bank 174 is different from that in other regions. Therefore, a height of the light-emitting layer 180 in the region adjacent to the second bank 174 can rise as it gets closer to the second bank 174.

Meanwhile, among the layers of the light-emitting layer 180, the electron auxiliary layer can be formed through a vacuum evaporation process. At this time, the electron auxiliary layer can be formed substantially over the entire surface of the substrate 110.

A second electrode 190 of a conductive material having a relatively low work function is formed on the light-emitting layer 180 substantially over the entire surface of the substrate 110. The second electrode 190 can be formed of aluminum (Al), magnesium (Mg), silver (Ag), or an alloy thereof. The second electrode 190 has a relatively thin thickness such that light from the light-emitting layer 180 can be transmitted therethrough. Alternatively, the second electrode 190 can be formed of a transparent conductive material such as indium-gallium-oxide (IGO), but is not limited thereto.

The first electrode 162, the light-emitting layer 180 and the second electrode 190 constitute a light-emitting diode De. The first electrode 162 can serve as an anode, and the second electrode 190 can serve as a cathode, but is not limited thereto.

As described above, the electroluminescent display device according to the embodiment of the present disclosure can be a top emission type in which light from the light-emitting layer 180 of the light-emitting diode De is output toward a direction opposite the substrate 110, that is, output to the outside through the second electrode 190. The top emission type display device can have a wider emission area than a bottom emission type display device of the same size, to thereby improve luminance and reduce power consumption.

The light-emitting diode De of each pixel region can have an element thickness for a micro-cavity effect corresponding to a wavelength of the emitted light, thereby increasing the light efficiency.

In the meantime, a protective layer and/or an encapsulating layer can be formed on the second electrode 190 substantially over the entire surface of the substrate 110 to block moisture or oxygen introduced from the outside, thereby protecting the light-emitting diode De.

First Embodiment

Figure 3:
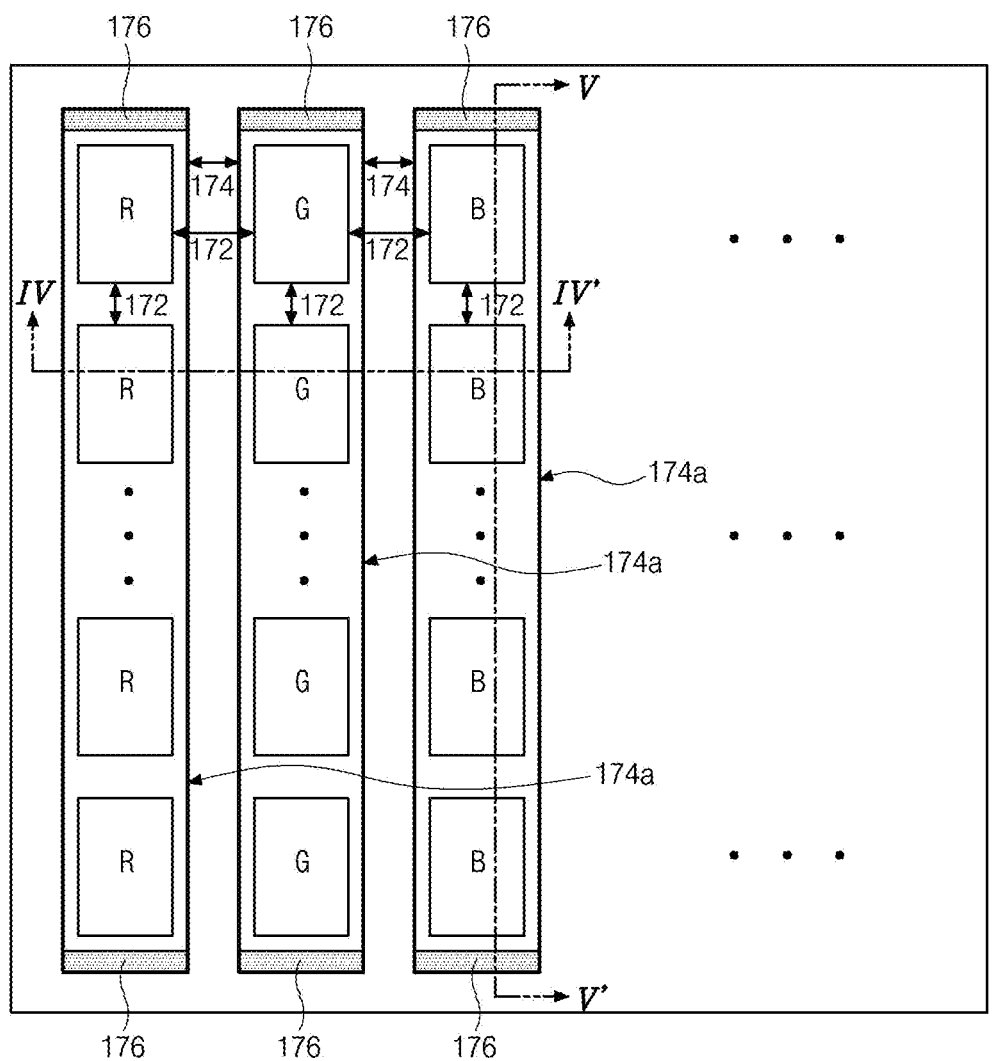
FIG. 3 is a schematic plan view of an electroluminescent display device according to a first embodiment of the present disclosure.

FIG. 3 is a schematic plan view of an electroluminescent display device according to a first embodiment of the present disclosure and mainly shows a bank configuration.

In FIG. 3, the electroluminescent display device according to the first embodiment of the present disclosure includes red, green and blue sub-pixels R, G and B. The red, green and blue sub-pixels R, G and B are sequentially arranged along a first direction, and the same color sub-pixels R, G and B are arranged along a second direction. For example, R, G and B sub-pixels are repeatedly arranged in that order along the first direction (e.g., horizontal direction), whereas a column of R sub-pixels, a column of G sub-pixels, and a column of B sub-pixels are repeatedly arranged in that order along the second direction (e.g., vertical direction). Here, the red, green and blue sub-pixels R, G and B are shown to each have a rectangular shape, but is not limited thereto. The red, green and blue sub-pixels R, G and B each can have various shapes such as a rectangular shape with rounded corners, an oval shape, or the like.

A first bank 172 is disposed between adjacent same color sub-pixels R, G and B and between adjacent different color sub-pixels R, G and B. Alternatively, the first bank 172 can be omitted between the adjacent different color sub-pixels R, G and B. That is, the first bank 172 can be formed between the adjacent sub-pixels R, G and B along the second direction and can extend along the first direction.

Further, the first bank 172 can enclose all the sub-pixels R, G and B.

A second bank 174 is disposed on the first bank 172. The second bank 174 has an opening 174a corresponding to a same color sub-pixel row and is disposed between adjacent different color sub-pixels R, G and B. At this time, the second bank 174 can have a narrower width than the first bank 172 between adjacent different color sub-pixels R, G and B.

Meanwhile, a third bank 176 is formed on each of side surfaces of the second bank 174 facing each other along the second direction. Namely, the third bank 176 is formed on the side surface of the second bank 174 corresponding to a short side of the opening 174a. Herein, the third bank 176 is disposed only in an edge portion of the display panel.

The first and third banks 172 and 176 have a hydrophilic property, and the second bank 174 has a hydrophobic property. Here, the third bank 176 can have a higher hydrophilic property than the first bank 172. That is, the third bank 176 can have a higher surface energy than the first bank 172. Alternatively, the first and third banks 172 and 176 can have the same hydrophilic property.

A cross-sectional structure of the electroluminescent display device of the present disclosure will be described with reference to FIG. 4 and FIG. 5.

Figure 4:
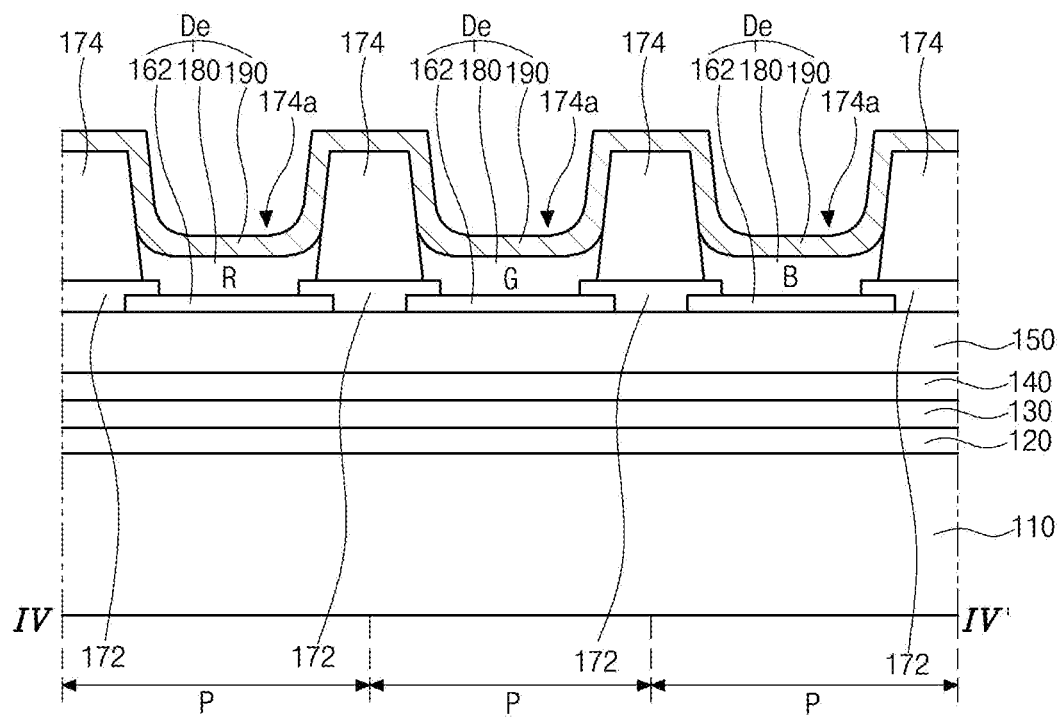
FIG. 4 is a cross-sectional view corresponding to the line IV-IV' of FIG. 3.
Figure 5:
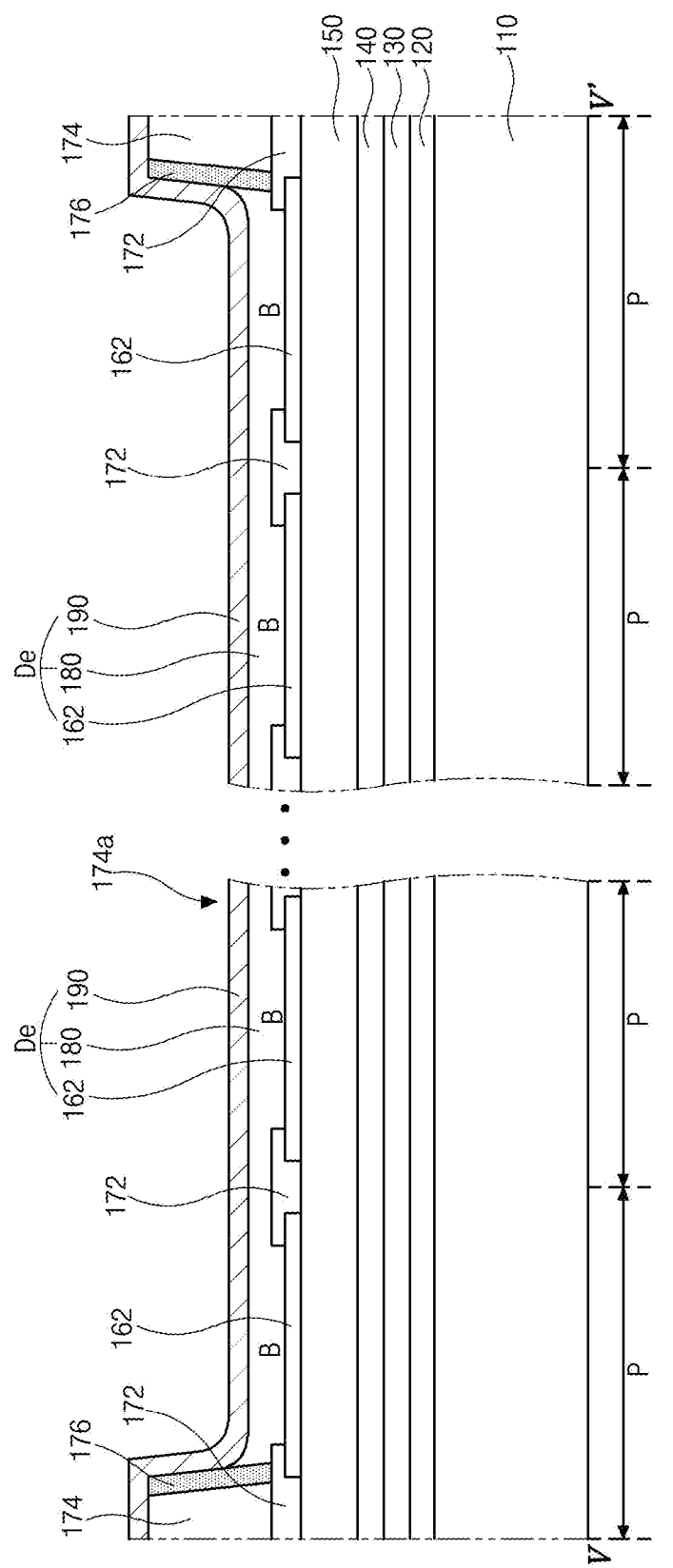
FIG. 5 is a cross-sectional view corresponding to the line V-V' of FIG. 3.

FIG. 4 is a cross-sectional view corresponding to the line IV-IV' of FIG. 3, and FIG. 5 is a cross-sectional view corresponding to the line V-V' of FIG. 3.

In FIG. 4 and FIG. 5, a buffer layer 120, a gate insulating layer 130, an interlayer insulating layer 140 and an overcoat layer 150 are sequentially formed on a substrate 110 on which a plurality of pixel regions P respectively corresponding to red, green and blue sub-pixels R, G and B are defined. A first electrode 162 is formed in each pixel region P on the overcoat layer 150.

One or more thin film transistors and/or capacitors having the configuration of FIG. 2 can be further formed between the substrate 110 and the overcoat layer 150, and the one or more thin film transistors can be connected to the first electrode 162.

A first bank 172 is formed on the first electrode 162. The first bank 172 overlaps and covers edges of the first electrode 162. The first bank 172 is formed between adjacent same color sub-pixels R, G and B and between adjacent different color sub-pixels R, G and B. Alternatively, the first bank 172 can be omitted between adjacent different color sub-pixels R, G and B and can be disposed only between adjacent same color sub-pixels R, G and B.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

In addition, a second bank 174 is formed on the first bank 172. The second bank 174 has a thicker thickness than the first bank 172. The second bank 174 is formed only between adjacent different color sub-pixels R, G and B and is not formed between adjacent same color sub-pixels R, G and B. A width of the second bank 174 is narrower than a width of the first bank 172 between adjacent different color sub-pixels R, G and B.

The second bank 174 has an opening 174a corresponding to a same color sub-pixel row and exposes the first electrodes 162 of the same color sub-pixel row and the first bank 172 between adjacent first electrodes 162 through the opening 174a.

Here, when the first bank 172 is omitted between adjacent different color sub-pixels R, G and B, the second bank 174 contacts and overlaps edges of each first electrode 162 of FIG. 4 and covers the edges of each first electrode 162 of FIG. 4.

The second bank 174 can be formed of an organic insulating material having a hydrophobic property. Alternatively, the second bank 174 can be formed of an organic insulating material having a hydrophilic property and can be subjected to a hydrophobic treatment.

The first bank 176 and the second bank 174 can be formed through a half-tone mask process.

Next, a third bank 176 is formed on each of opposite side surfaces of the second bank 174. At this time, the third bank 176 is formed at each of both ends of the same color sub-pixel row, i.e., on each of short sides of the opening 174a.

The third bank 176 can be formed of a material having a hydrophilic property, for example, an inorganic insulating material such as silicon oxide ($SiO_2$) or silicon nitride (SiNx). Alternatively, the third bank 176 can be formed of polyimide.

Here, the third bank 176 can be formed of a different material from the first bank 172 and can have a higher hydrophilic property than the first bank 172. That is, the third bank 176 can have a higher surface energy than the first bank 172. Alternatively, the third bank 176 can be formed of the same material as the first bank 172 and can have the same hydrophilic property as the first bank 172.

A light-emitting layer 180 is formed on the first electrode 162 exposed through the opening 174a of the second bank 174 in each pixel region P. Here, a red light-emitting layer is formed in the red sub-pixel R, a green light-emitting layer is formed in the green sub-pixel G, and a blue light-emitting layer is formed in the blue sub-pixel B.

In addition, the light-emitting layer 180 is also formed on the first bank 172 exposed through the opening 174a of the second bank 174 between adjacent same color sub-pixels R, G and B. Namely, in FIG. 5, the blue light-emitting layer 180 is also formed on the first bank 172 exposed through the opening 174a of the second bank 174 between adjacent blue sub-pixels B. At this time, the light-emitting layer 180 on the first bank 172 is connected to the light-emitting layer 180 on the first electrode 162 in each pixel region P adjacent thereto to thereby form one body.

The light-emitting layer 180 is formed through a solution process. Here, the solutions dropped into respective pixel regions P corresponding to the same color sub-pixels, for example, the blue sub-pixel row through different nozzles are connected to each other, and the light-emitting layer 180 is formed by drying the solutions. Accordingly, a deviation in the dropping amounts between the nozzles is minimized, and thicknesses of the light-emitting layers 180 can be uniform in the respective pixel regions P.

In addition, since the third bank 176 on the side surfaces of the second bank 174 has a hydrophilic property, the force for holding the solution at both ends of the same color sub-pixel row increases, thereby preventing the solution from being pulled into the center. Accordingly, it is possible to prevent the problem that the light-emitting layer 180 is not formed near both ends of the same color sub-pixel row.

A second electrode 190 is formed on the light-emitting layer 180 and the second bank 174. At this time, the second electrode 190 is also formed on a top surface and a side surface of the third bank 176, and the second electrode 190 contacts the top surface and the side surface of the third bank 176.

The first electrode 162, the light-emitting layer 180 and the second electrode 190 constitute a light-emitting diode De.

As described above, in the electroluminescent display device according to the first embodiment of the present disclosure, the light-emitting layers 180 of the same color sub-pixels R, G and B are connected to each other and formed as one body, thereby minimizing the deviation in the dropping amount between nozzles and uniformly forming the thicknesses of the light-emitting layers 180 of the sub-pixels R, G and B. Therefore, the mura is prevented, thereby effectively preventing the image quality of the display device from being lowered.

Further, the third bank 176 having the hydrophilic property is formed on the side surfaces of the second bank 174, thereby preventing the phenomenon that the solution is pulled into the center and the problem that the light-emitting layer 180 is not formed near both ends of the same color sub-pixel row.

A manufacturing process of an electroluminescent display device according to the first embodiment of the present disclosure will be described in detail with reference to FIGS. 6A to 6H.

FIGS. 6A to 6H are cross-sectional views schematically illustrating a manufacturing process of an electroluminescent display device according to the first embodiment of the present disclosure.

Figure 6A:
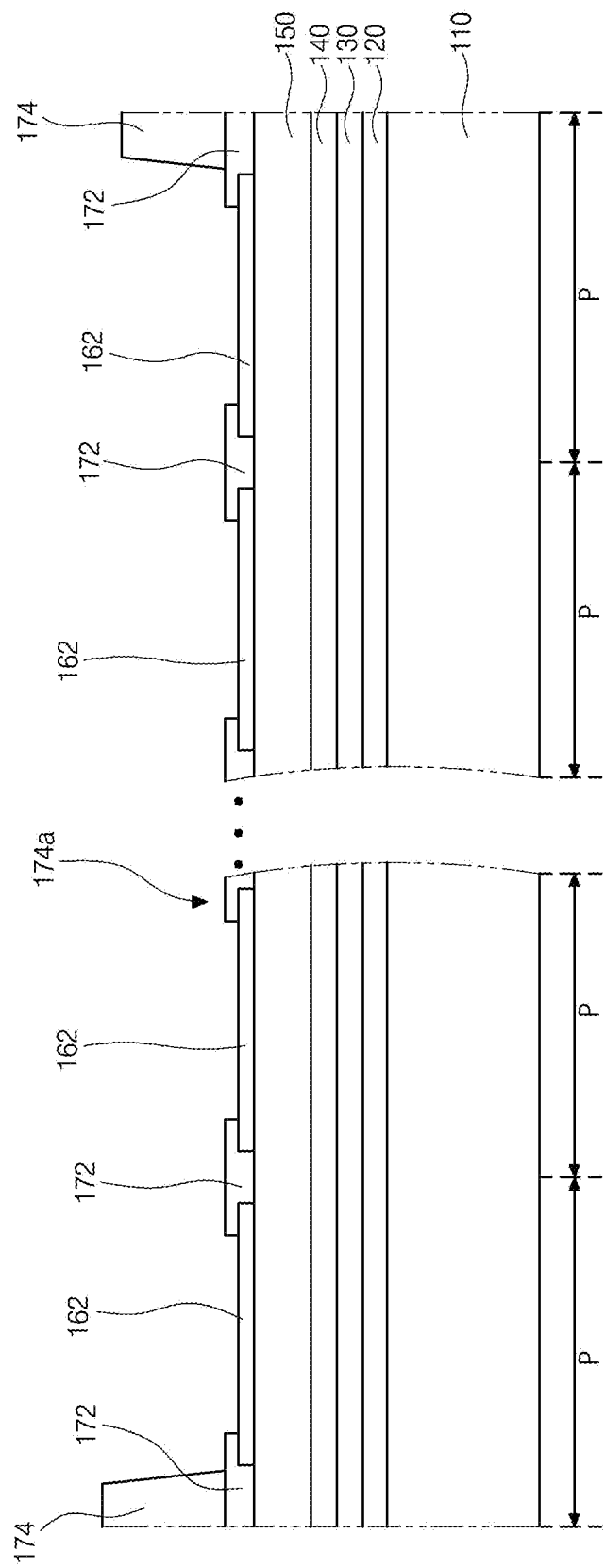
FIGS. 6A to 6H are cross-sectional views schematically illustrating a manufacturing process of an electroluminescent display device according to the first embodiment of the present disclosure.

In FIG. 6A, a buffer layer 120, a gate insulating layer 130, an interlayer insulating layer 140 and an overcoat layer 150 are sequentially formed of insulating materials on a substrate 110 on which a plurality of pixel regions P respectively corresponding to red, green and blue sub-pixels R, G and B are defined. Each of the buffer layer 120 and the gate insulating layer 130 can be formed by depositing an inorganic insulating material such as silicon oxide (SiO2) or silicon nitride (SiNx) substantially over an entire surface of the substrate 110. The interlayer insulating layer 140 can be formed by depositing an inorganic insulating material such as silicon oxide (SiO2) or silicon nitride (SiNx) substantially over an entire surface of the substrate 110 or applying an organic insulating material such as photo acryl or benzocyclobutene substantially over an entire surface of the substrate 110.

One or more thin film transistors and/or capacitors having the configuration of FIG. 2 can be further formed between the substrate 110 and the overcoat layer 150.

A first electrode 162 is formed of a conductive material in each pixel region P on the overcoat layer 150. The first electrode 162 can be formed by depositing a conductive material having a relatively high work function and patterning it through a photolithographic process using a mask.

For example, the first electrode 162 can be formed of a transparent conductive material such as indium tin oxide (ITO) or indium zinc oxide (IZO), but is not limited thereto. In addition, the first electrode 162 can further include a reflective electrode or a reflective layer formed of a metal material having a relatively high reflectance below the transparent conductive material. For example, the reflective electrode or reflective layer can be formed of an aluminum-palladium-copper (APC) alloy or silver (Ag). The first electrode 162 can have a triple-layer structure of ITO/APC/ITO or ITO/Ag/ITO, but is not limited thereto.

A first bank 172 is formed of an insulating material on the first electrode 162. The first bank 172 can be formed by depositing an inorganic insulating material such as silicon oxide ($SiO_2$) or silicon nitride (SiNx) and patterning it through a photolithographic process using a mask. Alternatively, the first bank 172 can be formed by applying polyimide and patterning it.

The first bank 172 is disposed between adjacent pixel regions P and covers edges of the first electrode 162. The first bank 172 can be disposed only between the pixel regions P having the same color.

Then, a second bank 174 is formed of an insulating material on the first bank 172. The second bank 174 is formed by applying an organic insulating material having a hydrophobic property and patterning it through a photolithographic process using a mask. Alternatively, the second bank 174 can be formed by applying an organic insulating material having a hydrophilic property, patterning it through a photolithographic process using a mask, and performing a hydrophobic treatment.

The second bank 174 is disposed between adjacent pixel regions P having different colors. The second bank 174 has an opening 174a corresponding to a same color pixel row which includes the pixel regions P having the same color and exposes the first electrodes 162 of the same color pixel row and the first bank 172 between adjacent first electrodes 162 through the opening 174a.

Figure 6B:
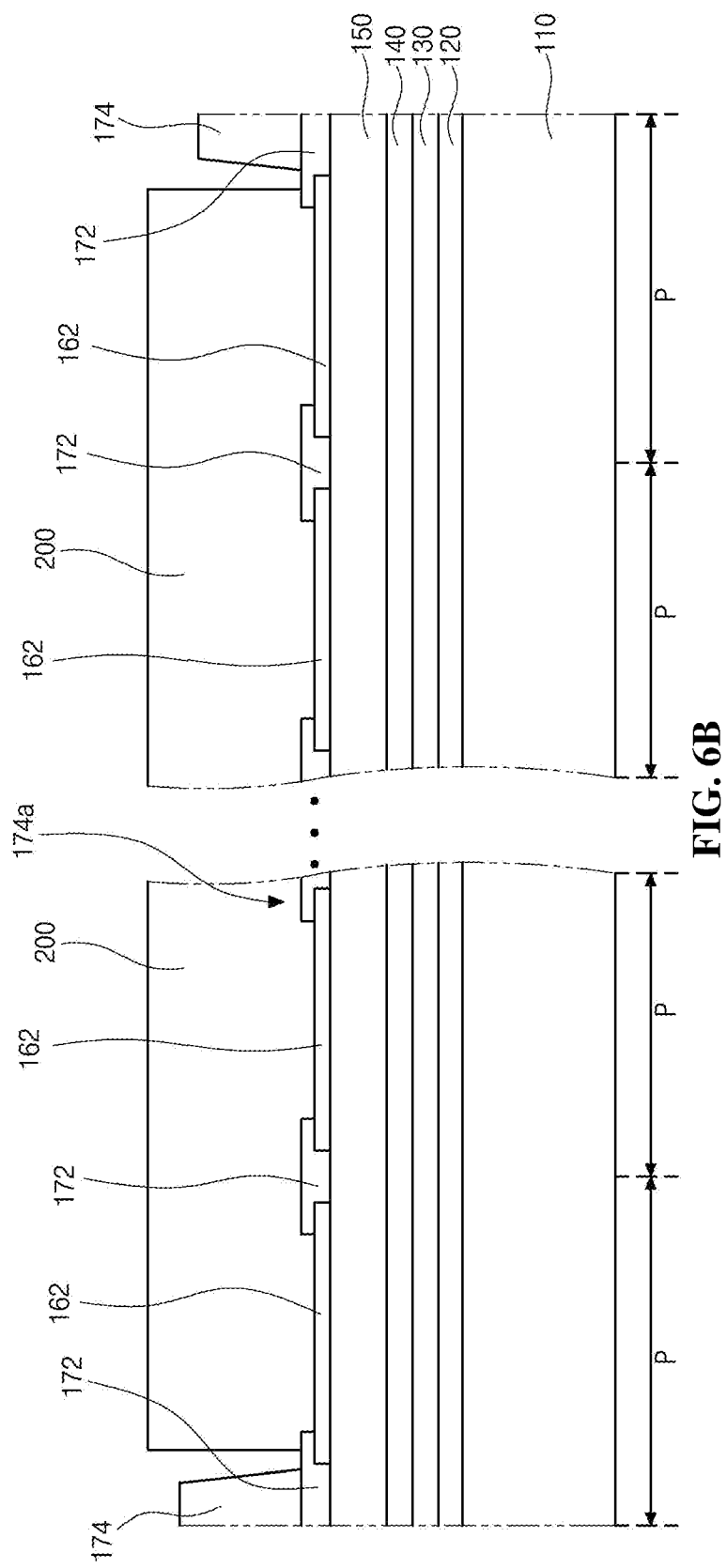

Next, in FIG. 6B, a photoresist pattern 200 is formed by applying a photoresist and developing it.

The photoresist pattern 200 is disposed in the opening 174a. The photoresist pattern 200 covers the first bank 172 between the first electrodes 162 of the same color pixel row and exposes the second bank 174 at both ends in the context of the figure. Further, the photoresist pattern 200 can partially expose a top surface of the first bank 172 under the second bank 174.

The photoresist pattern 200 can cover a top surface and a side surface of the second bank 174 between the pixel regions P having different colors.

Figure 6C:
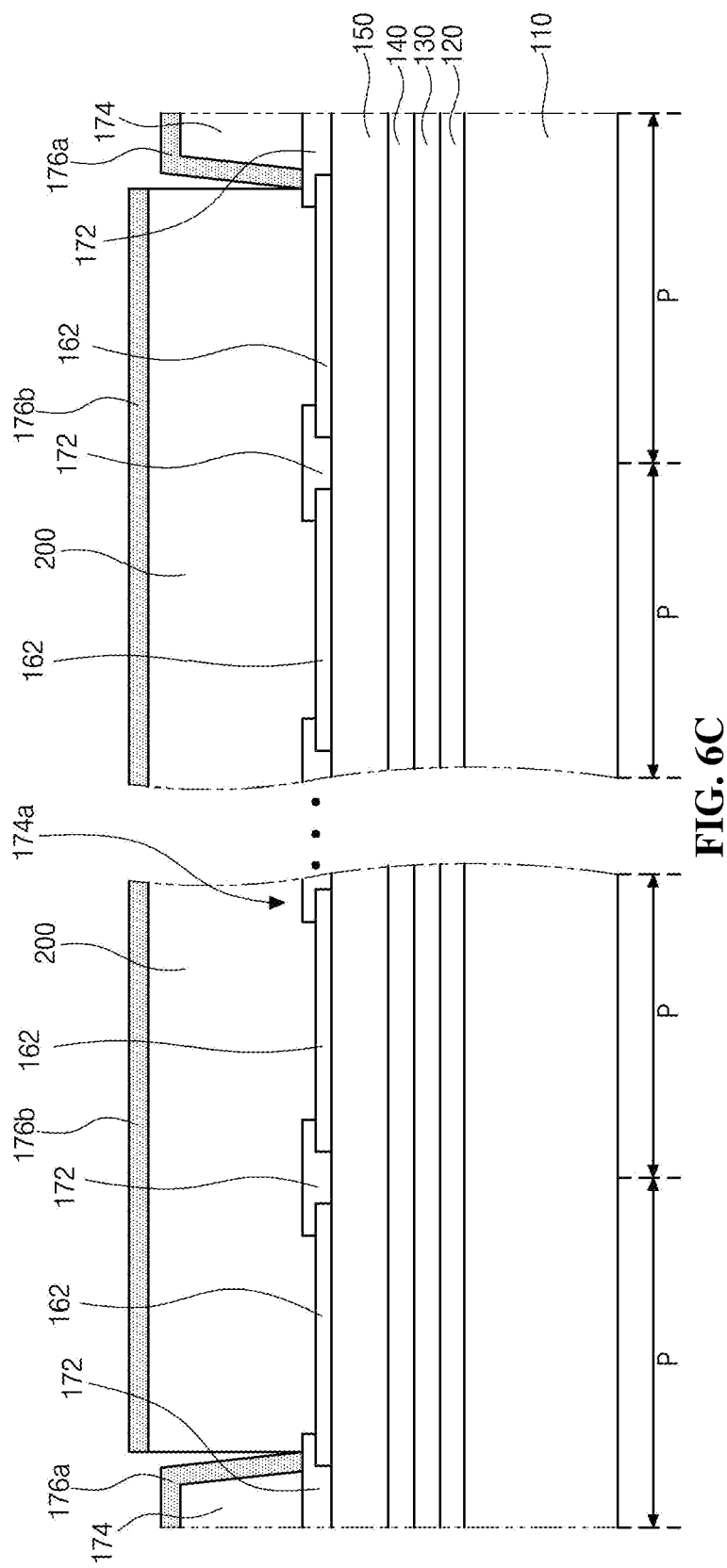

Next, in FIG. 6C, a first insulating pattern 176a and a second insulating pattern 176b are formed of an insulating material. The first insulating pattern 176a is formed on a top surface and a side surface of the second bank 174, and the second insulating pattern 176b is formed on the photoresist pattern 200. The first and second insulating patterns 176a and 176b can be separated from each other. Here, the first insulating pattern 176a can be also formed on the top surface of the first bank 172 partially exposed.

The first and second insulating patterns 176a and 176b can be formed by depositing a material having a hydrophilic property, for example, an inorganic insulating material such as silicon oxide ($SiO_2$) or silicon nitride (SiNx). Alternatively, the first and second insulating patterns 176a and 176b can be formed of polyimide.

Figure 6D:
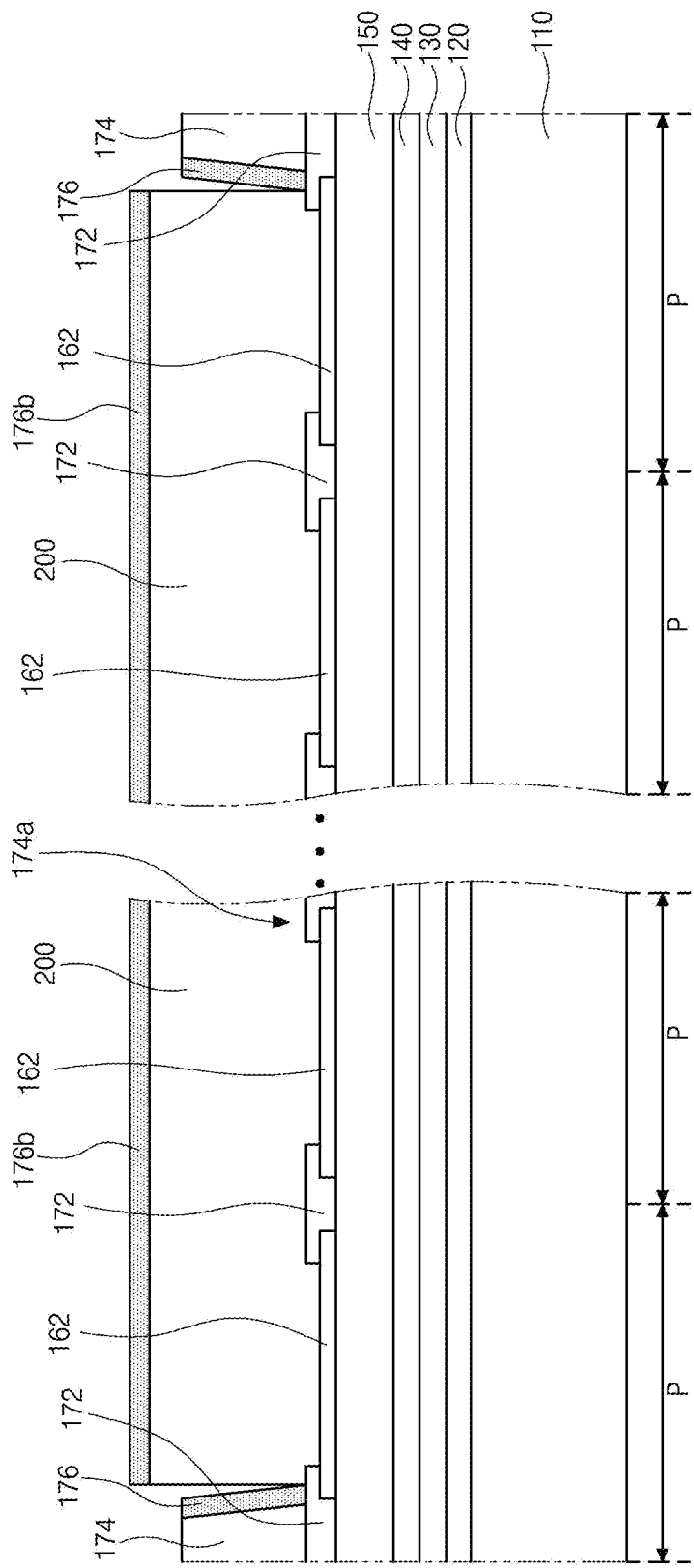

In FIG. 6D, the first insulating pattern 176a of FIG. 6C on the top surface of the second bank 174 is removed to thereby form a third bank 176 on the side surface of the second bank 174.

At this time, the second insulating pattern 176b on the photoresist pattern 200 can be partially or entirely removed.

Figure 6E:
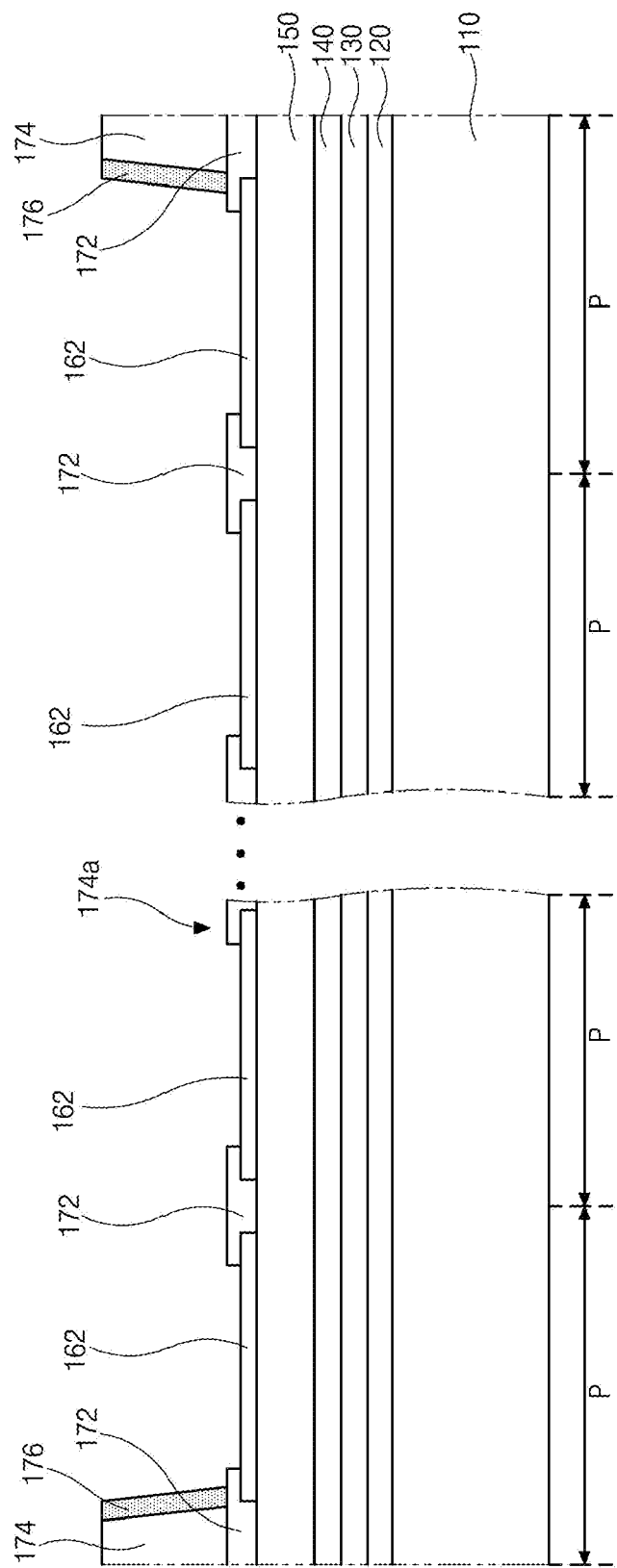

Next, in FIG. 6E, the photoresist pattern 200 of FIG. 6D and the second insulating pattern 176b of FIG. 6D are removed. At this time, the second insulating pattern 176b of FIG. 6D can be removed together with the photoresist pattern 200 of FIG. 6D by removing the photoresist pattern 200 of FIG. 6D through a liftoff process. Accordingly, the first electrode 162 and the first bank 172 in the opening 174a are exposed.

Figure 6F:
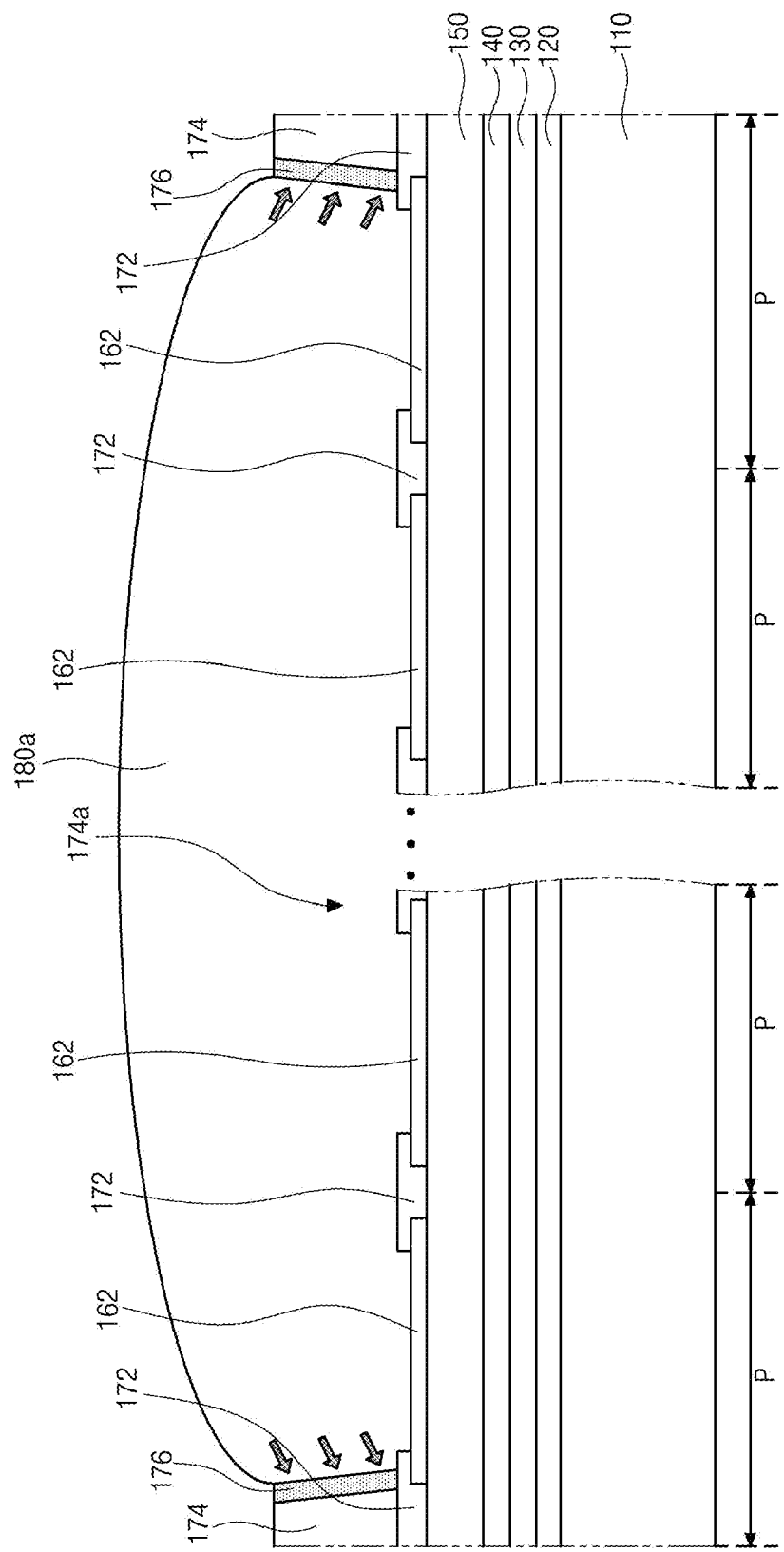

In FIG. 6F, a solution layer 180a is formed on the first electrode 162 and the first bank 172 exposed through the opening 174a by dropping a luminescent material solution using an injection apparatus including a plurality of nozzles.

At this time, the second bank 174 has a hydrophobic property. Even if the solution layer 180a is applied to the top surface of the second bank 174, the solution layer 180a is prevented from overflowing into an adjacent pixel region P having a different color.

Further, since the third bank 176 has a hydrophilic property, the third bank 176 holds the solution layer 180a at both ends of the opening 174a, and the solution is prevented from being pulled into the center.

Figure 6G:
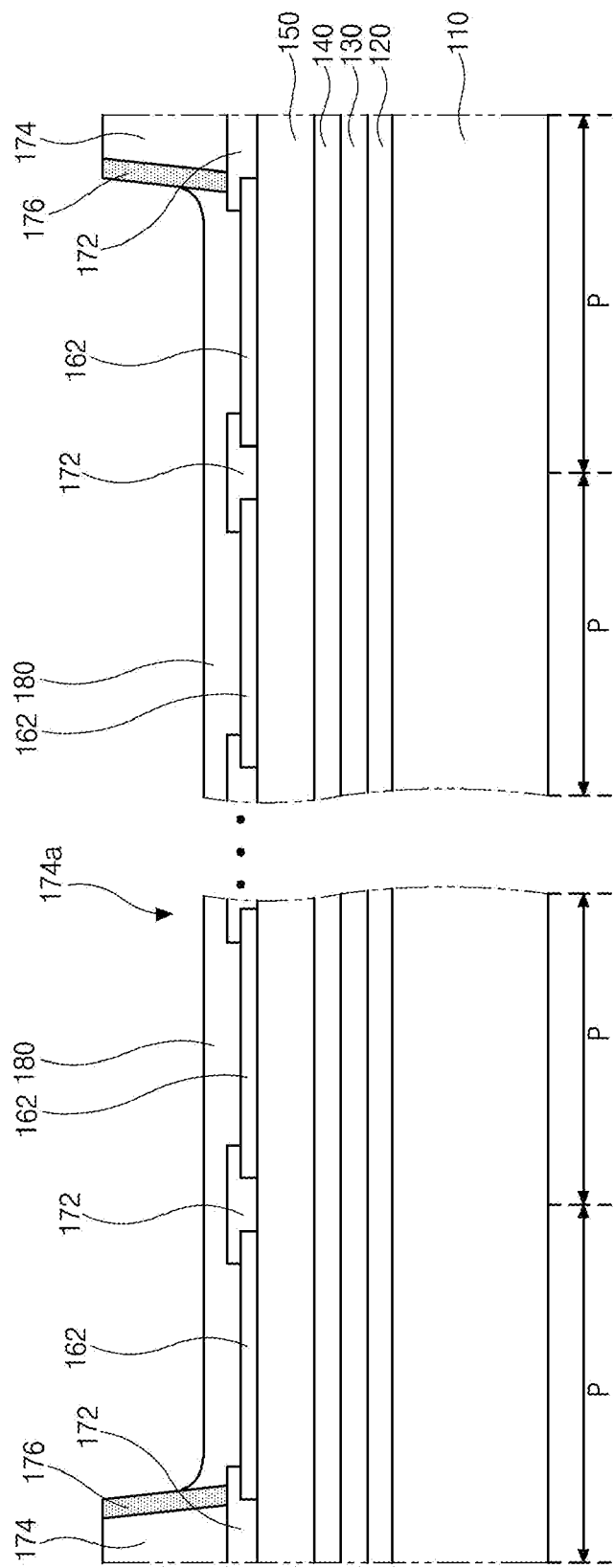

Next, in FIG. 6G, a light-emitting layer 180 is formed on the first electrodes 162 in the opening 174a by drying the solution layer 180a of FIG. 6F. At this time, solvent in the solution layer 180a of FIG. 6F can be evaporated by performing a vacuum dry process. When the solution is dried, a drying speed of the solvent in a region adjacent to the second bank 174 is different from that in other regions. Therefore, a height of the light-emitting layer 180 in the region adjacent to the second bank 174 can rise as it gets closer to the second bank 174.

Here, the light-emitting layer 180 is also formed on the first bank 172 in the opening 174a. The light-emitting layer 180 on the first bank 172 is connected to the light-emitting layer 180 on the first electrode 162 of the pixel region P adjacent thereto and is formed as one body.

Figure 6H:
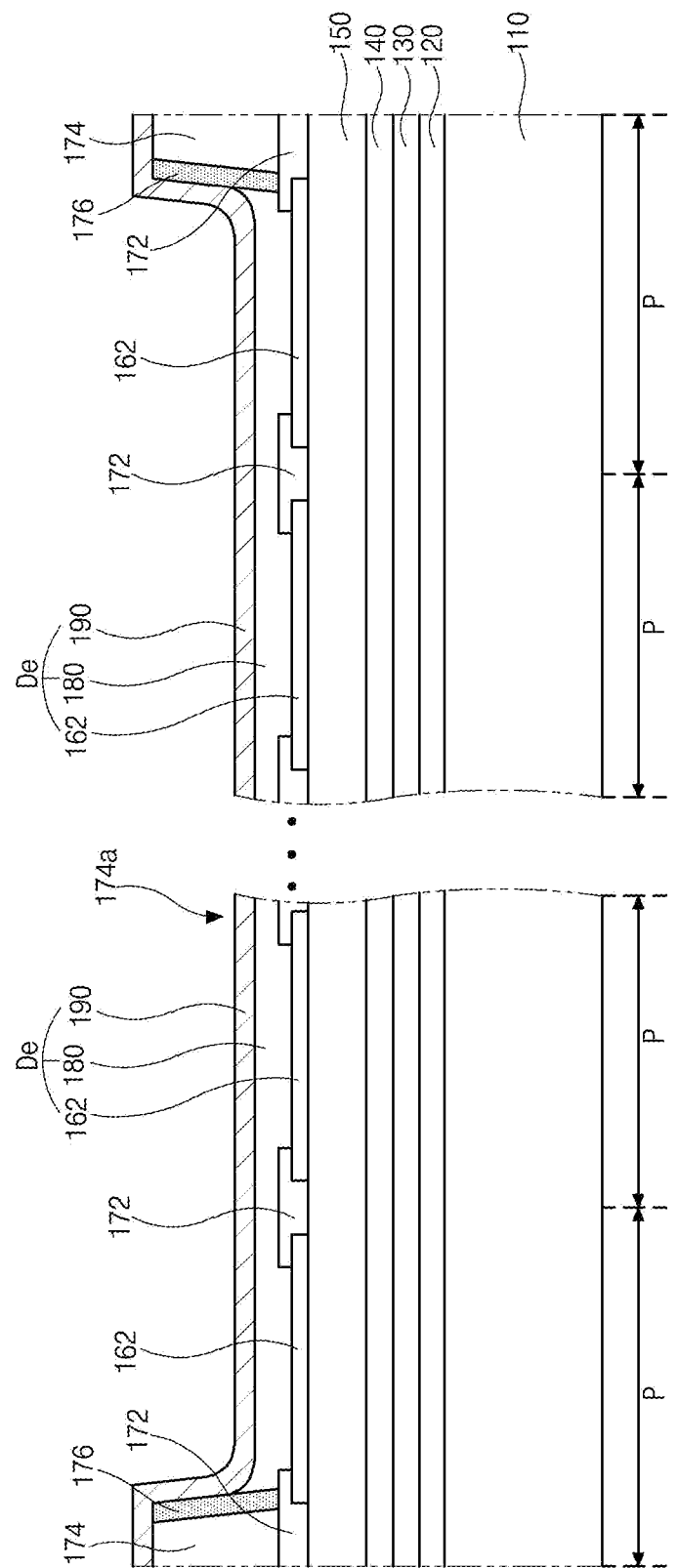

In FIG. 6H, a second electrode 190 is formed substantially over an entire surface of the substrate 110 by depositing a conductive material having a relatively low work function through a sputtering method or the like on the light-emitting layer 180. The second electrode 190 can be formed of aluminum (Al), magnesium (Mg), silver (Ag), or an alloy thereof. The second electrode 190 has a relatively thin thickness such that light from the light-emitting layer 180 can be transmitted therethrough. Alternatively, the second electrode 190 can be formed of a transparent conductive material such as indium-gallium-oxide (IGO), but is not limited thereto.

In the electroluminescent display device according to the first embodiment of the present disclosure, the light-emitting layer 180 is formed through the solution process, and a display device with a large size and high definition can be implemented.

Additionally, in the electroluminescent display device according to the first embodiment of the present disclosure, the light-emitting layers 180 of the pixel regions P having the same color are connected to each other and formed as one body, thereby minimizing the deviation in the dropping amount between nozzles and uniformly forming the thicknesses of the light-emitting layers 180 of the respective pixel regions P. Therefore, the mura is prevented, thereby effectively preventing the image quality of the display device from being lowered.

Further, the third bank 176 having the hydrophilic property is formed on the side surfaces of the second bank 174 corresponding to short sides of the opening 174a, thereby preventing the phenomenon that the solution is pulled into the center and the defects in formation of the light-emitting layer 180.

Second Embodiment

Figure 7:
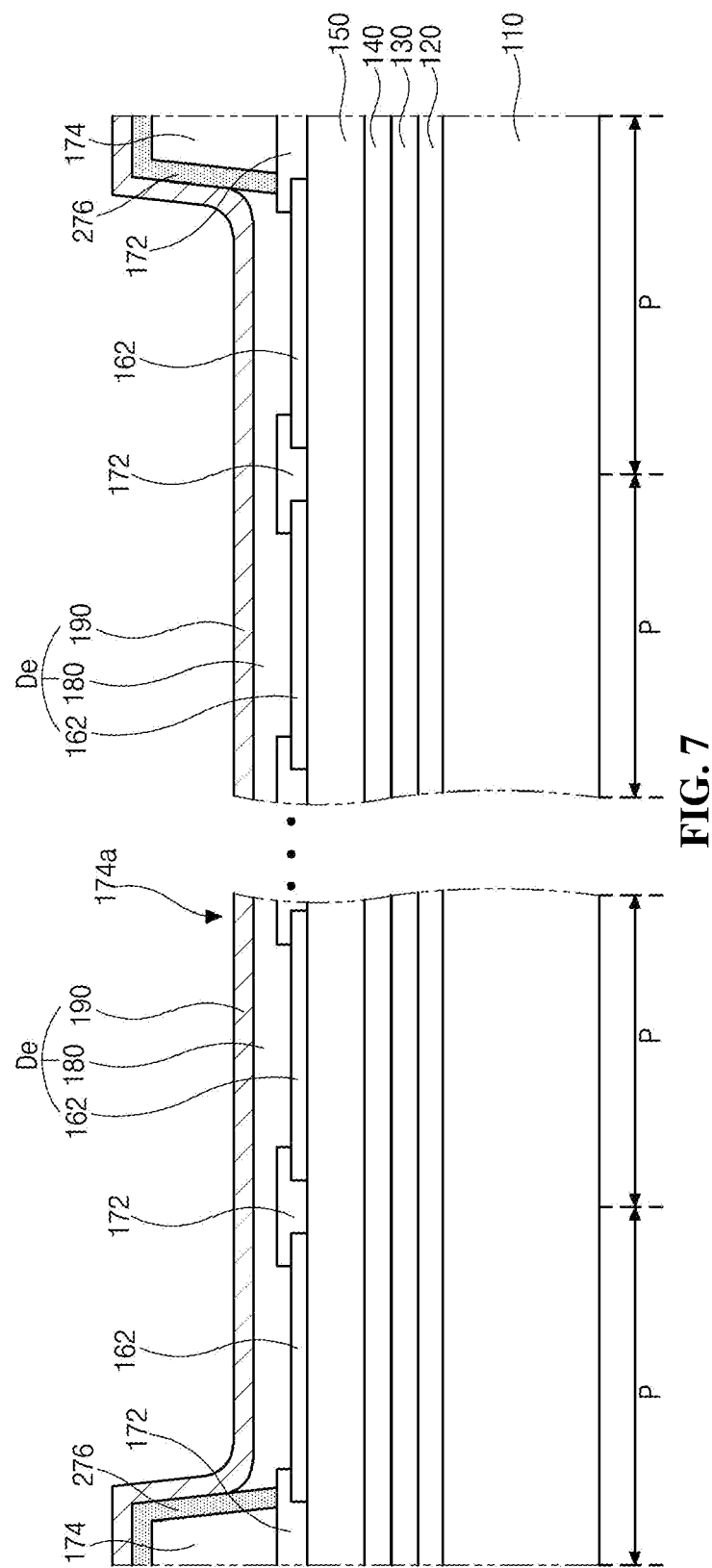
FIG. 7 is a schematic cross-sectional view of an electroluminescent display device according to a second embodiment of the present disclosure.

FIG. 7 is a schematic cross-sectional view of an electroluminescent display device according to a second embodiment of the present disclosure. The second embodiment has difference(s) in the structure of the third bank from the first embodiment. The same parts will be designated by the same references, and descriptions of the same parts will be omitted or will be brief.

In FIG. 7, an overcoat layer 150 is formed on a substrate 110 on which a plurality of pixel regions P respectively corresponding to red, green and blue sub-pixels R, G and B are defined. A first electrode 162 is formed in each pixel region P on the overcoat layer 150.

A first bank 172 having a hydrophilic property is formed on the first electrode 162. The first bank 172 overlaps and covers edges of the first electrode 162. The first bank 172 is formed between adjacent pixel regions P having the same color. In addition, the first bank 172 can be further formed between adjacent pixel regions P having different colors.

A second bank 174 having a hydrophobic property is formed on the first bank 172. The second bank 174 has an opening 174a corresponding to a same color pixel row which includes the pixel regions P having the same color and exposes the first electrodes 162 of the same color pixel row and the first bank 172 between adjacent first electrodes 162 through the opening 174a. Further, the second bank 174 is formed between adjacent pixel regions P having different colors.

A third bank 276 is formed on each of opposite side surfaces of the second bank 174. At this time, the third bank 276 is formed at each of both ends of the same color pixel row, i.e., on each of short sides of the opening 174a. Here, the third bank 276 is also formed on a top surface of the second bank 174. Meanwhile, the third bank 276 is not formed on a top surface of the second bank 174 between adjacent pixel regions P having different colors.

A light-emitting layer 180 is formed on the first electrode 162 exposed through the opening 174a of the second bank 174 in each pixel region P. In addition, the light-emitting layer 180 is also formed on the first bank 172 exposed through the opening 174a of the second bank 174, and the light-emitting layer 180 on the first bank 172 is connected to the light-emitting layer 180 on the first electrode 162 of the pixel region P adjacent thereto and is formed as one body. The light-emitting layer 180 is formed thorough a solution process.

A second electrode 190 is formed on the light-emitting layer 180. At this time, the second electrode 190 is also formed on a top surface and a side surface of the third bank 276, and the second electrode 190 contacts the top surface and the side surface of the third bank 276. Further, the second electrode 190 is also formed on the top surface and the side surface of the second bank 174 between adjacent pixel regions P having different colors.

As described above, in the electroluminescent display device according to the second embodiment of the present disclosure, the light-emitting layers 180 of the pixel regions P having the same color are connected to each other and formed as one body, thereby minimizing the deviation in the dropping amount between nozzles and uniformly forming the thicknesses of the light-emitting layers 180 of the respective pixel regions P. Therefore, the mura is prevented, thereby effectively preventing the image quality of the display device from being lowered.

Further, the third bank 276 having the hydrophilic property is formed on the side surfaces of the second bank 174, thereby preventing the phenomenon that the solution is pulled into the center and the problem that the light-emitting layer 180 is not formed near both ends of the same color pixel row.

In addition, the electroluminescent display device according to the second embodiment has advantages of the simple process because the third bank 276 can be easily formed as compared with the first embodiment.

At this time, in the electroluminescent display device according to the second embodiment, the photoresist pattern 200 is formed as shown in FIG. 6B, and the first and second insulating patterns 176a and 176b are formed as shown in FIG. 6C. Then, the photoresist pattern 200 and the second insulating pattern 176b are removed, thereby forming the third bank 276 comprising the first insulating pattern 176a.

Third Embodiment

Figure 8:
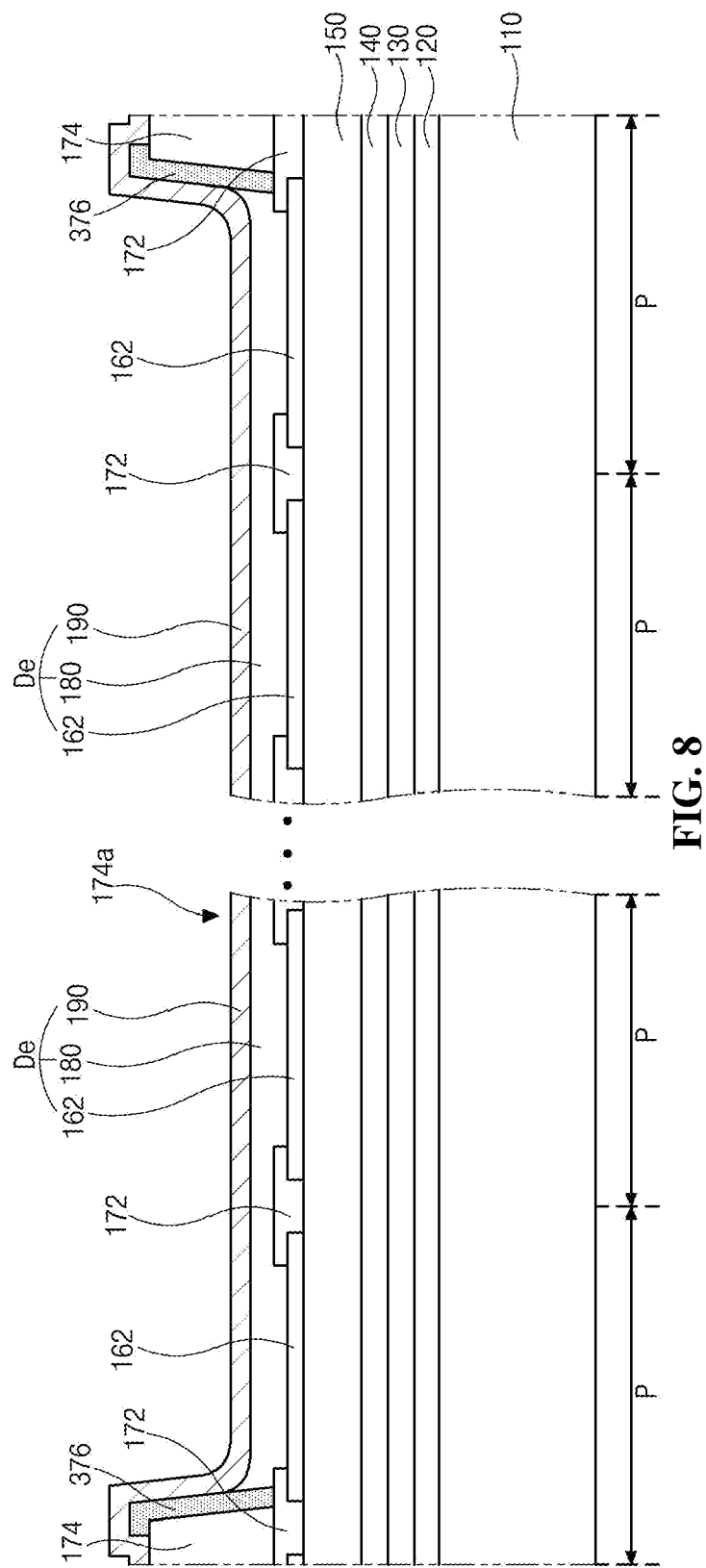
FIG. 8 is a schematic cross-sectional view of an electroluminescent display device according to a third embodiment of the present disclosure.

FIG. 8 is a schematic cross-sectional view of an electroluminescent display device according to a third embodiment of the present disclosure. The third embodiment has difference(s) in the structure of the third bank from the first embodiment. The same parts will be designated by the same references, and descriptions of the same parts will be omitted or will be brief.

In FIG. 8, an overcoat layer 150 is formed on a substrate 110 on which a plurality of pixel regions P respectively corresponding to red, green and blue sub-pixels R, G and B are defined. A first electrode 162 is formed in each pixel region P on the overcoat layer 150.

A first bank 172 having a hydrophilic property is formed on the first electrode 162. The first bank 172 overlaps and covers edges of the first electrode 162. The first bank 172 is formed between adjacent pixel regions P having the same color. In addition, the first bank 172 can be further formed between adjacent pixel regions P having different colors.

A second bank 174 having a hydrophobic property is formed on the first bank 172. The second bank 174 has an opening 174a corresponding to a same color pixel row which includes the pixel regions P having the same color and exposes the first electrodes 162 of the same color pixel row and the first bank 172 between adjacent first electrodes 162 through the opening 174a. Further, the second bank 174 is formed between adjacent pixel regions P having different colors.

A third bank 376 is formed on each of opposite side surfaces of the second bank 174. At this time, the third bank 376 is formed at each of both ends of the same color pixel row, i.e., on each of short sides of the opening 174a. Here, the third bank 376 is also formed partially on a top surface of the second bank 174 and exposes the top surface of the second bank 174. Meanwhile, the third bank 376 is not formed on a top surface of the second bank 174 between adjacent pixel regions P having different colors.

A light-emitting layer 180 is formed on the first electrode 162 exposed through the opening 174a of the second bank 174 in each pixel region P. In addition, the light-emitting layer 180 is also formed on the first bank 172 exposed through the opening 174a of the second bank 174, and the light-emitting layer 180 on the first bank 172 is connected to the light-emitting layer 180 on the first electrode 162 of the pixel region P adjacent thereto and is formed as one body. The light-emitting layer 180 is formed thorough a solution process.

A second electrode 190 is formed on the light-emitting layer 180. At this time, the second electrode 190 is also formed on a top surface and a side surface of the third bank 376, and the second electrode 190 contacts the top surface and the side surface of the third bank 376. Further, the second electrode 190 is also formed on the top surface and the side surface of the second bank 174 between adjacent pixel regions P having different colors.

As described above, in the electroluminescent display device according to the third embodiment of the present disclosure, the light-emitting layers 180 of the pixel regions P having the same color are connected to each other and formed as one body, thereby minimizing the deviation in the dropping amount between nozzles and uniformly forming the thicknesses of the light-emitting layers 180 of the respective pixel regions P. Therefore, the mura is prevented, thereby effectively preventing the image quality of the display device from being lowered.

Further, the third bank 376 having the hydrophilic property is formed on the side surfaces of the second bank 174, thereby preventing the phenomenon that the solution is pulled into the center and the problem that the light-emitting layer 180 is not formed near both ends of the same color pixel row.

In addition, the electroluminescent display device according to the third embodiment has advantages of the simple process because the third bank 376 can be easily formed as compared with the first embodiment. Moreover, since the second bank 174 having the hydrophobic property is exposed, the electroluminescent display device according to the third embodiment can prevent the solution from overflowing into an adjacent pixel region P having a different color as compared with the second embodiment.

In the present disclosure, by forming the light-emitting layer of each sub-pixel through the solution process, a mask is omitted to thereby reduce the manufacturing costs, and a display device with a large size and high definition can be implemented.

Moreover, the light-emitting layers of the same color sub-pixels are connected to each other and formed as one body, thereby minimizing the deviation in the dropping amount between nozzles and uniformly forming the thicknesses of the light-emitting layers of the sub-pixels. Therefore, the mura is prevented, thereby effectively preventing the image quality of the display device from being lowered.

Moreover, since the hydrophilic bank is formed on the side surfaces of the hydrophobic bank corresponding to both ends of the same color sub-pixel row, the solution is prevented from being pulled into the center, and it is possible to prevent or address the problem that the light-emitting layer is not formed near both ends of the same color sub-pixel row.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. An electroluminescent display device comprising:
   a plurality of sub-pixels arranged on a substrate, the plurality of sub-pixels including sub-pixels with different colors arranged along a first direction and sub-pixels with the same color arranged along a second direction;
   a light-emitting diode disposed at each sub-pixel and including a first electrode, a light-emitting layer and a second electrode;
   a first bank disposed between adjacent sub-pixels along the second direction and overlapping edges of the first electrode;
   a second bank having an opening corresponding to the sub-pixels arranged along the second direction and disposed between adjacent sub-pixels along the first direction; and
   a third bank on side surfaces of the second bank facing each other along the second direction corresponding to the opening.

2. The electroluminescent display device of claim 1, wherein the first and third banks have a hydrophilic property and the second bank has a hydrophobic property.

3. The electroluminescent display device of claim 2, wherein the third bank has a higher surface energy than the first bank.

4. The electroluminescent display device of claim 1, wherein the third bank is further formed partially on a top surface of the second bank.

5. The electroluminescent display device of claim 1, wherein the first bank further includes a portion formed between adjacent sub-pixels along the first direction.

6. The electroluminescent display device of claim 5, wherein the portion of the first bank formed between the adjacent sub-pixels along the first direction is formed under the second bank.

7. The electroluminescent display device of claim 1, wherein light-emitting layers on first electrodes of the sub-pixels arranged along the second direction are connected to a light-emitting layer on the first bank between adjacent sub-pixels along the second direction to form one body.

8. The electroluminescent display device of claim 1, wherein the emitting layer has a higher height in an edge portion of the opening of the second bank than in a center portion of the opening.

9. The electroluminescent display device of claim 1, wherein the first bank and the second bank are formed through a half-tone mask process.

10. The electroluminescent display device of claim 1, wherein the light-emitting layer is formed through a solution process.

11. A method of manufacturing an electroluminescent display device, the method comprising:

forming a first electrode in each sub-pixel on a substrate on which a plurality of sub-pixels including sub-pixels with different colors arranged along a first direction and sub-pixels with the same color arranged along a second direction are defined;

forming a first bank disposed between adjacent sub-pixels along the second direction, the first bank overlapping edges of the first electrode;

forming a second bank on the first bank, the second bank having an opening corresponding to the sub-pixels arranged along the second direction and disposed between adjacent sub-pixels along the first direction;

forming a photoresist pattern corresponding to the opening, the photoresist pattern covering the first electrode and the first bank and exposing the second bank;

forming a first insulating pattern and a second insulating pattern, the first insulating pattern disposed on a top surface and side surfaces of the second bank, and the second insulating pattern disposed on the photoresist pattern;

forming a third bank on the side surfaces of the second bank by removing the photoresist pattern and the second insulating pattern;

forming a solution layer in the opening and contacting the third bank;

forming a light-emitting layer by drying the solution layer; and forming a second electrode on the light-emitting layer.

12. The method of claim 11, further comprising selectively removing the first insulating pattern on the top surface of the second bank before forming the third bank.

13. The method of claim 11, wherein the first and third banks have a hydrophilic property and the second bank has a hydrophobic property.

14. The method of claim 13, wherein the third bank has a higher surface energy than the first bank.

* * * * *